(12) United States Patent
Wilkinson et al.

(10) Patent No.: US 9,647,827 B1
(45) Date of Patent: May 9, 2017

(54) PRECISION CLOCK ENABLED TIME-INTERLEAVED DATA CONVERSION

(71) Applicant: Raytheon Company, Waltham, MA (US)

(72) Inventors: Steven R. Wilkinson, Stevenson Ranch, CA (US); Bishara Shamee, Playa Del Rey, CA (US)

(73) Assignee: Raytheon Company, Waltham, MA (US)

( * ) Notice: Subject to any disclaimer, the term of this patent is extended or adjusted under 35 U.S.C. 154(b) by 8 days.

(21) Appl. No.: 14/921,157

(22) Filed: Oct. 23, 2015

(51) Int. Cl.
*H04B 10/00* (2013.01)
*H04L 7/00* (2006.01)
*H04L 7/08* (2006.01)

(52) U.S. Cl.
CPC .......... *H04L 7/0075* (2013.01); *H04L 7/0037* (2013.01); *H04L 7/08* (2013.01)

(58) Field of Classification Search
CPC ........ H04L 7/0075; H04L 7/08; H04L 7/0037
See application file for complete search history.

(56) References Cited

U.S. PATENT DOCUMENTS

| | | | |
|---|---|---|---|
| 5,502,748 A * | 3/1996 | Wilkinson | G11B 27/3027 370/514 |
| 6,707,411 B1 * | 3/2004 | Poulton | G11C 7/16 341/123 |
| 7,956,788 B2 | 6/2011 | Lee et al. | |
| 8,780,948 B2 * | 7/2014 | Wilkinson | H01S 3/1303 372/18 |
| 2003/0090767 A1 * | 5/2003 | Yap | G02B 6/2861 398/183 |

(Continued)

FOREIGN PATENT DOCUMENTS

| | | |
|---|---|---|
| EP | 2521268 A1 | 11/2012 |
| EP | 2660821 A1 | 11/2013 |

OTHER PUBLICATIONS

Khilo, Anatol, et al., "Photonic ADC: overcoming the bottleneck of electronic jitter", Optical Society of America, (Feb. 8, 2012), 16 pgs.

(Continued)

*Primary Examiner* — Danny Leung
(74) *Attorney, Agent, or Firm* — Schwegman Lundberg & Woessner, P.A.

(57) ABSTRACT

An apparatus comprises a photonic oscillator circuit configured to generate optical signals that are separated by a uniform delay; radio frequency (RF) generating circuitry configured to receive the optical signals and produce a series of reference clock signals having a same clock signal frequency, wherein each reference clock signal in the series includes a uniform delay from a previous clock signal in the series; and a plurality of analog-to-digital converter (ADC) circuits, wherein an ADC circuit includes a signal input to directly receive an RF input signal that is continuous in time and amplitude, and a clock input to receive a reference clock signal of the repeating series of reference clock signals, wherein the ADC circuits are configured to sample a RF input signal at the frequency of the reference clock signal with the uniform delay to sample interleaved digital values representing the RF signal.

21 Claims, 6 Drawing Sheets

(56) References Cited

U.S. PATENT DOCUMENTS

| | | | |
|---|---|---|---|
| 2003/0091097 A1* | 5/2003 | Yap | G02F 2/002 375/132 |
| 2004/0136649 A1* | 7/2004 | Mangir | H04B 10/2537 385/27 |
| 2004/0264977 A1* | 12/2004 | Yap | G02F 2/02 398/161 |
| 2005/0013612 A1* | 1/2005 | Yap | G02F 2/002 398/53 |
| 2006/0098823 A1 | 5/2006 | Venes et al. | |
| 2010/0277354 A1* | 11/2010 | Lee | H03M 1/1215 341/137 |
| 2013/0215918 A1* | 8/2013 | Wilkinson | H01S 3/1303 372/29.022 |
| 2015/0123713 A1 | 5/2015 | Kahmen | |

OTHER PUBLICATIONS

Valley, George C, "Photonic analog-to-digital converters", Optical Society of America, (2007), 28 pgs.

"International Application Serial No. PCT/US2016/048170, International Search Report mailed Nov. 16, 2016", 5 pgs.

"International Application Serial No. PCT/US2016/048170, Written Opinion mailed Nov. 16, 2016", 10 pgs.

Zhongying, Wu, et al., "A promising optoelectronic clock solution to time-interleaved ADC", Proceedings of the 8th International Conference on Sensing Technology, [Online] Retrieved from the internet: <URL:http ://s2i s.org/1CST-2014/papers/15699 61639.pdf>, (Sep. 4, 2014), 372-375.

"High-Speed DACs Application Note", Tektronic, (Dec. 30, 2014), 1-18.

"Taiwanese Application Serial No. 105126119, Office Action mailed Jan. 23, 2017", 10 pgs.

\* cited by examiner

US 9,647,827 B1

PRECISION CLOCK ENABLED TIME-INTERLEAVED DATA CONVERSION

BACKGROUND

Analysis of radio frequency (RF) analog signals is desired in applications such as radar systems, imaging systems, and RF communication systems. The RF analog signals can be converted to digital values and the digital values can be processed and analyzed using signal processing equipment. The RF signals of interest can have signal frequencies of several giga-hertz (GHz). Converting these high frequency analog signals to digital values for processing in real time is challenging.

OVERVIEW

This document relates generally to conversion of electrical RF signals and microwave signals to data. A method example includes generating a repeating series of reference clock signals using a photonic oscillator, wherein each reference clock signal in the series includes a same reference clock signal frequency and a uniform delay from a previous reference clock signal in the series; receiving a generated reference clock signal at each of a plurality of analog-to-digital converter (ADC) circuits; receiving a radio frequency (RF) signal directly at each of the plurality ADC circuits, wherein the RF signal is continuous in time and amplitude; and sampling the RF signal using the ADC circuits with the uniform delay to create interleaved digital values representing the RF signal.

An apparatus example includes a photonic oscillator circuit configured to generate optical signals that are separated by a uniform delay; radio frequency (RF) generating circuitry configured to receive the optical signals and produce a series of reference clock signals having a same clock signal frequency, wherein each reference clock signal in the series includes a uniform delay from a previous clock signal in the series; and a plurality of analog-to-digital converter (ADC) circuits, wherein an ADC circuit includes a signal input to directly receive an RF input signal that is continuous in time and amplitude, and a clock input to receive a reference clock signal of the repeating series of reference clock signals, wherein the ADC circuits are configured to sample a RF input signal at the frequency of the reference clock signal with the uniform delay to sample interleaved digital values representing the RF signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document discusses systems and methods for converting electrical RF signals to digital data. Accurate conversion of multi-GHz analog signals to digital data is a goal for radar systems, imaging systems, and communication systems. Conversion of the signals requires a high sample rate for the analog-to-digital converter (ADC) circuits. The high frequency of the RF analog signals can result in the analog-to-digital A/D conversion being a limiting factor in performance of the systems. An approach to increasing the sampling rate of ADCs is to time interleave a bank of ADC circuits operating at a lower sample rate and combine the output of the bank of ADCs to achieve a higher effective sample rate. However, the time interleaving imposes strict timing and synchronization requirements on both the timing clock circuit and the distribution network of the timing clock.

Conventional approaches for high rate data converters use phase locked loops, delay locked loops, and on chip clock signal distribution domains to distribute the clock signal in a uniform manner. Some approaches to time interleaving include a tradeoff between the clock rate and the number of converters interleaved. For example, if a lower clock rate is used, the number of interleaved data converters is increased. However, increasing the number of data converters increases cost, increases power requirements, and add stringent matching requirements to the timing of operation of the data converters.

A precision photonic oscillator (PPO) provides a stable precise frequency clock reference. Frequency stability, as a used herein, refers to frequency variation at one second or with a one second averaging. A frequency stability of $10^{-15}$, for example, refers to the standard deviation of a series of frequency measurements within a one second averaging time per measurement.

Figure 1:
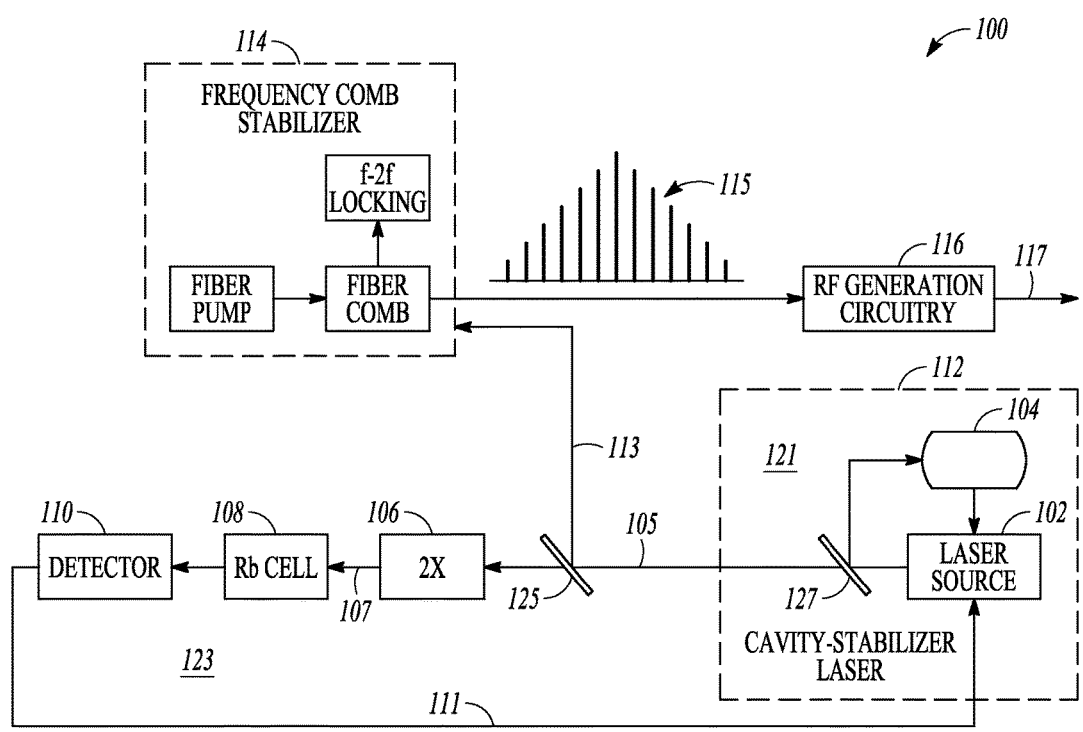
FIG. 1 is a block diagram of an example of an ultra-stable frequency reference generating system useable as a precision photonic oscillator.

FIG. 1 is a block diagram of an example of an ultra-stable frequency reference generating system 100 useable as a precision photonic oscillator. The system is referenced to an atomic transition. The ultra-stable frequency reference generating system 100 includes a cavity-stabilized reference laser 112 that includes a laser source 102 locked to a stabilized cavity 104. The system may include a Rubidium (Rb) cell 108 that may be interrogated by a stabilized laser output 105 of the cavity-stabilized reference laser 112 which may cause at least a two-photon Rubidium transition (to an upper state) within the Rubidium cell 108. A detector 110 may detect fluorescence 109 within the Rubidium cell 108 resulting from the spontaneous decay of the upper state Rubidium transition. The detector 110 may provide a detector output 111 at a wavelength of the fluorescence to lock the cavity-stabilized reference laser 112 to generate a stabilized laser output 113. In these embodiments, the laser source 102 is locking to both the stabilized cavity 104 and the Rubidium transition within the Rubidium cell 108.

In some embodiments, the ultra-stable frequency reference generating system 100 may also include a frequency doubler 106 to double the frequency of the stabilized laser output 105. The doubled stabilized laser output 107 may be configured to interrogate the Rubidium cell 108 to generate an output for use in locking the laser source 102 to the Rubidium transition.

The ultra-stable frequency reference generating system 100 may also include a frequency comb stabilizer 114, which may be locked to the stabilized laser output 113. The frequency comb stabilizer 114 may generate an output of optical wavelengths which may comprise a super-continuum 115 of optical wavelengths. The super-continuum 115 may be an octave span of wavelengths, although the scope of the embodiments is not limited in this respect. In some embodiments, the spacing between the optical comb teeth may be determined by a femtosecond laser pulse repetition frequency of a femtosecond laser that may be used to generate the frequency comb.

In some embodiments, the ultra-stable frequency reference generating system 100 includes or is coupled to RF generating circuitry 116 to generate the ultra-stable frequency reference 117 from the super-continuum 115 of optical wavelengths. The ultra-stable frequency reference 117 may comprise one or more ultra-stable RF or microwave output signals. The RF generating circuitry 116 may include, among other things, a photo detector to convert the super-continuum 115 of optical wavelengths to the ultra-stable frequency reference 117. In some embodiments, the ultra-stable frequency reference 117 may comprise a set of RF or microwave signals.

As illustrated in FIG. 1, two complementary lock loops may be used to generate the stabilized laser output 113. A cavity-lock loop 121 may lock the laser source 102 to the stabilized cavity 104. The cavity-lock loop 121 may help short-term phase noise performance of the system 100. The other lock loop is a frequency control loop 123 that may lock the laser source 102 to the Rubidium transition within the Rubidium cell 108. The frequency control loop 123 may help reduce long-term environmental drift to help achieve longer-term stability. In these embodiments, the frequency control loop 123 may lock the laser source to a decay of an upper state Rubidium transition using two-photon excitation to generate the stabilized laser output.

In these embodiments, by locking the laser source 102 to a stabilized cavity 104, variation of the laser frequency of the cavity-stabilized reference laser 112 may be reduced. By locking the output of the cavity-stabilized reference laser 112 to an atomic transition (i.e., a two-photon Rubidium transition), the variation of the laser frequency is further reduced. Without the use of any locking loops, the frequency of the laser output may drift by several mega-hertz (MHz) over the course of a few minutes. Locking to the stabilized cavity 104 may reduce this drift substantially (e.g., by almost a million times or more). Locking to the two-photon Rubidium transition may remove any slow drift that remains. Accordingly, frequency fluctuations and drifts have been removed or at least largely reduced so that the output 113 is considered stabilized.

The system 100 may provide significant improvement in long-term stability and phase noise over many conventional clocking systems. For example, the ultra-stable frequency reference 117 generated by the ultra-stable frequency reference generating system 100 may have a frequency stability of at least $5\times10^{-14}$ or greater, and may even have a frequency stability exceeding $5\times10^{-15}$. The ultra-stable frequency reference 117 may further have a phase noise of less than $-100$ dBc/Hz at one Hz off a 10 GHz carrier, for example.

An approach to an ultra-stable frequency reference system can be found in U.S. Pat. No. 8,780,948, Wilkenson et al., "Precision Photonic Oscillator and Method for Generating an Ultra-Stable Frequency Reference Using a Two-Photon Rubidium Transition, filed Feb. 20, 2012, which is incorporated herein by reference in its entirety.

The clock reference signals generated by the ultra-stable frequency reference system 100 can be used as a precision photonic oscillator to address the issues related to the synchronizing of a bank of time-interleaved high speed ADCs. As described previously herein, such a photonic oscillator exhibits low ultra-low phase noise and an ultra-stable clock reference. The resulting stability in the phase relationship between the reference clocks eliminates the need for extra circuitry typically used to manage the conventional mismatch between clock references. For example, typical time interleaved data converters need a front-end interleaving stage to de-multiplex the incoming analog signal among each of the lower clock rate data converters. The front-end stage also typically requires a sample-and-hold stage to allow sampling by the lower clock rate data converters. However, with the ultra-stable photonic oscillator, the data converters may sample the incoming analog signal directly without a de-multiplexing stage or a sample-and-hold stage.

Figure 2:
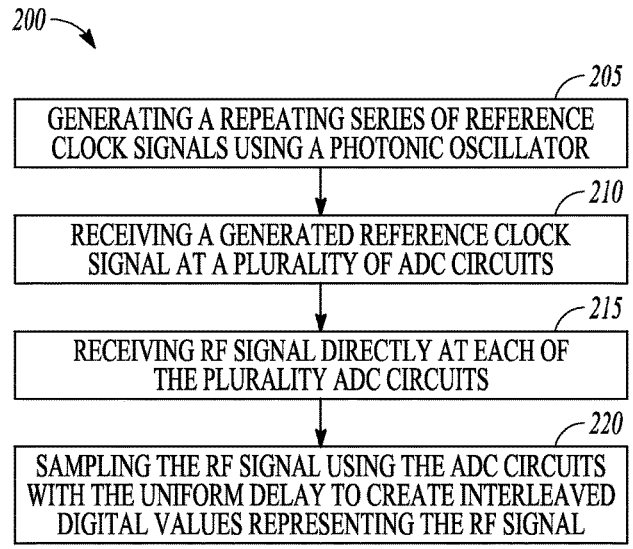
FIG. 2 is a flow diagram of an example of a method of implementing precision clock enabled time-interleaved data conversion.

FIG. 2 is a flow diagram of an example of a method 200 of implementing precision clock enabled time-interleaved data conversion. At 205, a repeating series of reference clock signals is generated using a photonic oscillator. Each reference clock signal in the series includes a same reference clock signal frequency and a uniform delay from a previous reference clock signal in the series.

Figure 3:
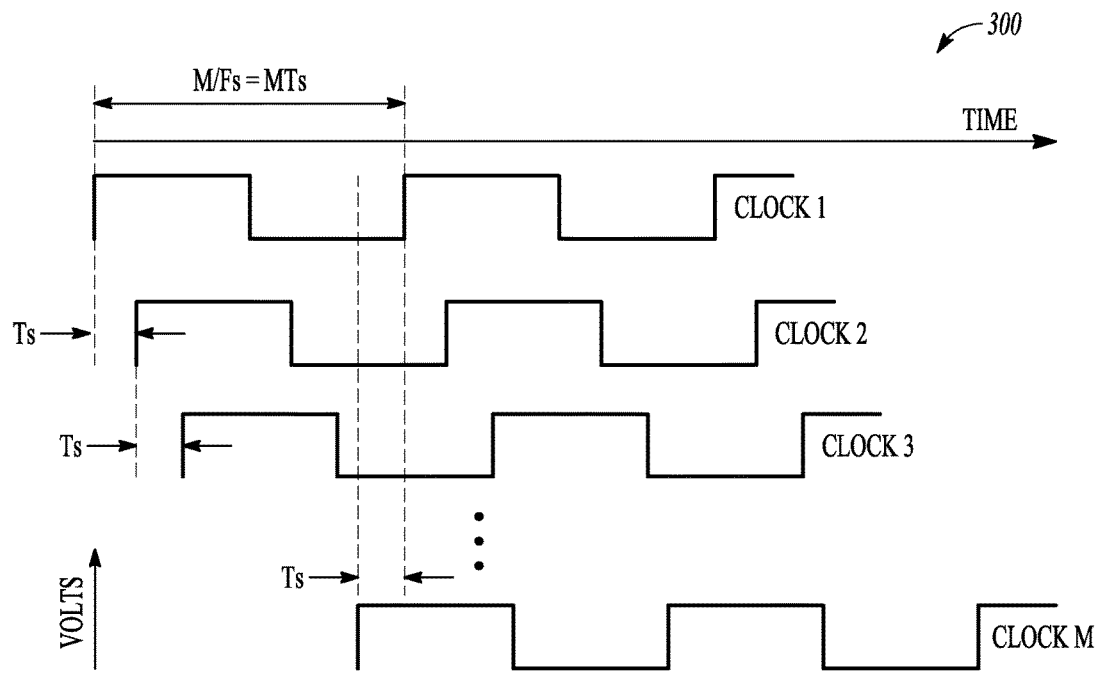
FIG. 3 is a timing diagram illustrating a set of clock reference signals.

FIG. 3 is a timing diagram 300 illustrating a set of clock reference signals. The timing diagram represents M reference clock signals, where M is a positive integer. As shown in the diagram, each clock signal has the same clock frequency as a reference clock signal and each clock signal has a uniform delay (Ts) from the previous clock signal. The relationship between clock signals is maintained by the ultra-low noise and ultra-stable frequency of the photonic oscillator.

Returning to FIG. 2 at 210, a generated reference clock signal is received at an ADC circuit. In some embodiments, there are M ADC circuit and each ADC circuit receives a reference clock signal. The ADC circuits provide high speed sampling of radio frequency or microwave frequency signals.

At 215, a radio frequency (RF) signal is received directly at each of the plurality ADC circuits. The input RF signal is an analog signal that is continuous in time and amplitude. The RF signal is received at the ADC circuits for sampling by the ADC circuit without any front end circuitry stage, such as a de-multiplexing stage or a track-and-hold stage for example.

At 220, the RF signal is sampled using the ADC circuits with the uniform delay of the clock reference signals. The sampling is used to create interleaved digital values representing the RF signal. In some embodiments, the interleaved digital values are stored (e.g., in memory) as a digital representation of the RF signal. In the example of M ADC circuits, the interleaving can result in a digital representation of the RF signal sampled at M times the reference clock signal frequency.

Figure 4:
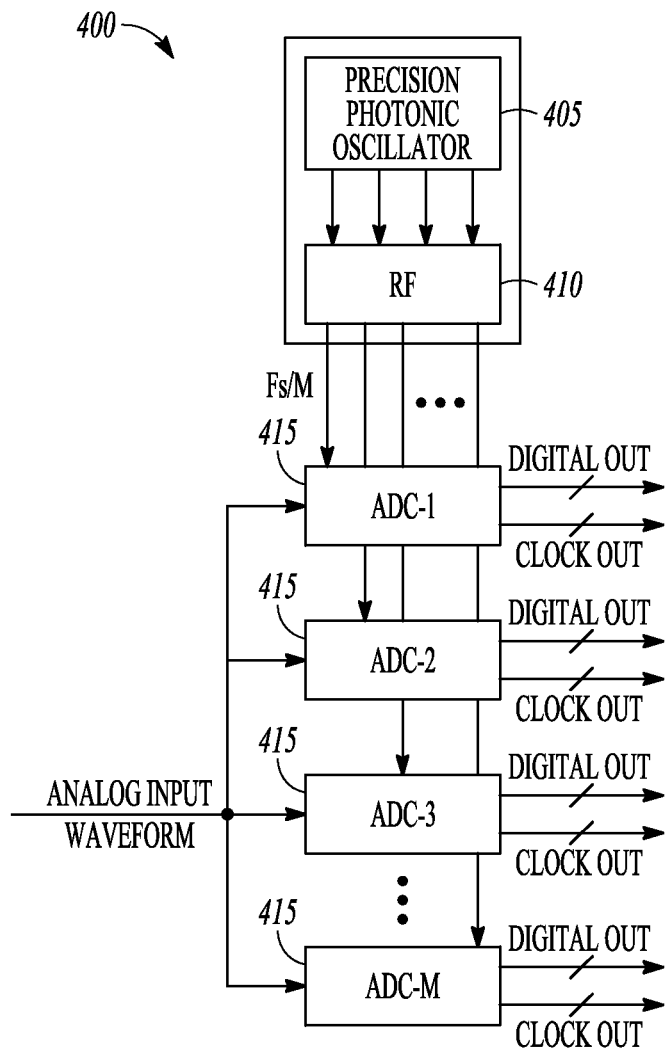
FIG. 4 is a block diagram of an example of a device that includes a photonic oscillator circuit integrated with time interleaved data converters.

FIG. 4 is a block diagram of an example of a device 400 that includes a photonic oscillator circuit 405 integrated with time interleaved data converters. The photonic oscillator circuit 405 generates optical signals having optical wavelengths. In some embodiments, the optical signals are generated using a frequency comb stabilizer included in the photonic oscillator circuit 405 that is locked to a stabilized laser source. The optical signals are separated by a uniform delay. In some embodiments, the photonic oscillator circuit has a frequency stability of $10^{-15}$. The device 400 also includes RF generating circuitry 410.

Figure 5:
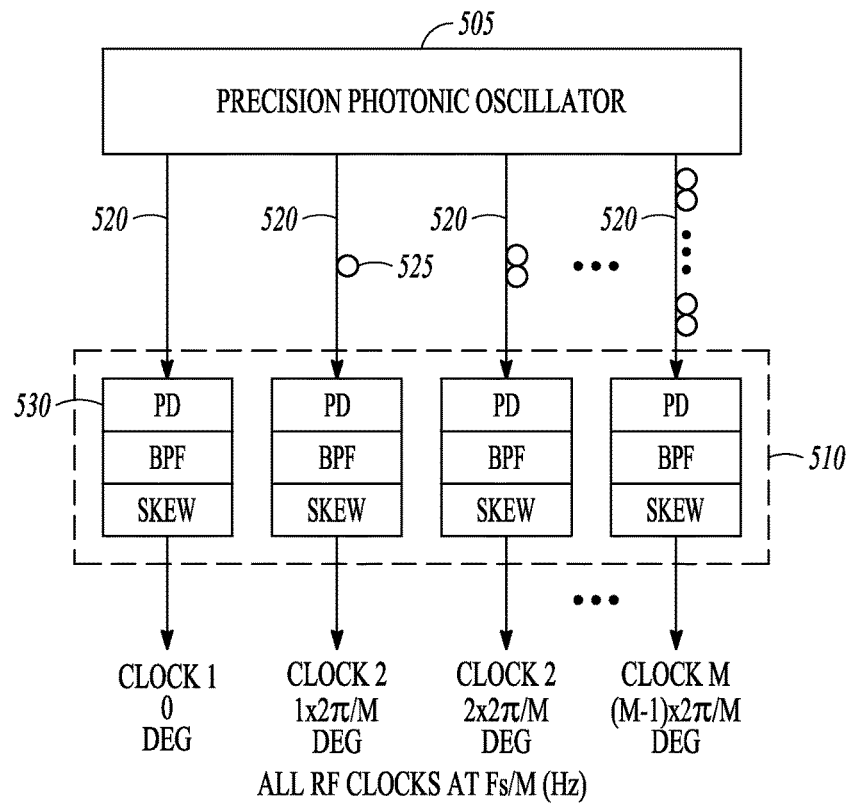
FIG. 5 is a block diagram of portions of an example of a photonic oscillator circuit coupled to RF generating circuitry.

FIG. 5 is a block diagram of portions of an example of a photonic oscillator circuit 505 coupled to RF generating circuitry 510. The photonic oscillator circuit 505 provides optical signals 520 to the RF generating circuitry 510. The RF generating circuitry 510 includes a detector array of photo-detector circuits (PD). A photo-detector circuit 530 receives an optical signal from the photonic oscillator circuit 505 and produces an electrical clock signal for the series of reference clock signals. The delay between the optical signals is represented by the circles 525 in the diagram, and the delays are present in the electrical clock signals. Thus, the Clock 2 signal has one delay time from the Clock 1 signal, the Clock 3 signal has two delay times from the Clock 1 signal, and the Clock M signal has M−1 delay times from the Clock 1 signal. In some embodiments, the photo-detector circuits 530 are electrically coupled to bandpass filter circuits 535 (BPF) to select the reference clock signal frequency. The RF generating circuitry 510 may include skew adjust circuits 540 to remove any residual skew in the inter-signal delay that may occur due to manufacturing.

Returning to FIG. 4, the RF generating circuitry 410 receives the optical signals from the photonic oscillator circuit 405 and produces a series of reference clock signals that have the same clock signal frequency. In some embodiments, the clock signal frequency of the series of reference clock signals is greater than 1 GHz. Each reference clock signal in the series includes the uniform delay from its previous clock signal in the series. The device 400 further includes multiple ADC circuits 415 and the RF reference clock signals are provided to the ADC circuits.

Each of the ADC circuits 415 includes a signal input to directly receive the analog RF input signal and a clock input to receive a reference clock signal of the repeating series of reference clock signals. The ADC circuits 415 sample the same analog RF input signal with a sampling frequency that is the frequency of the reference clock signal. The ADC circuits can be arranged in parallel and each ADC circuit generates a sample of the same RF input signal separated in time by the uniform phase delay between clock reference signals. The sampling repeats with each repeating series of reference clock signals. If there are M ADC circuits, the ADC circuits produce M samples per sampling cycle. The sampling produces interleaved digital values representing the analog RF signal.

Figure 6:
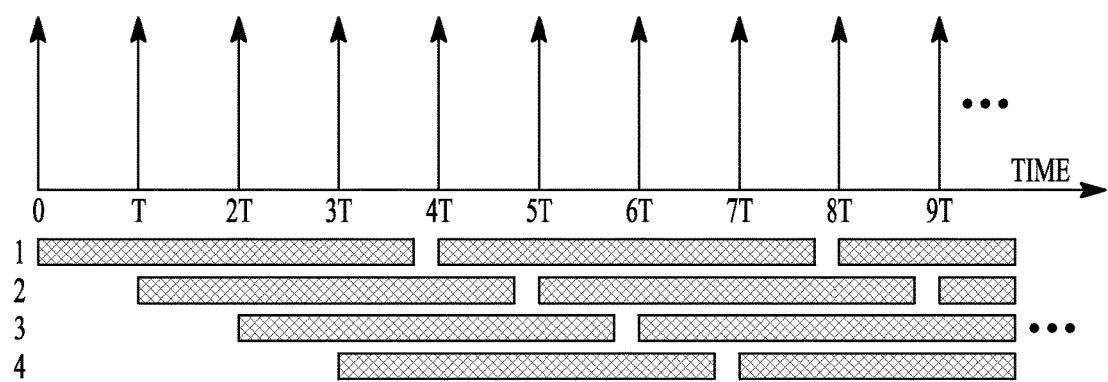
FIG. 6 is a timing diagram of an example of interleaved digital-to-analog conversion.

FIG. 6 shows an example of four interleaved ADCs (or M=4). Each ADC operates with a delay T from the previous stage. The sampling/conversion cycle repeats every M(T) seconds.

Figure 7:
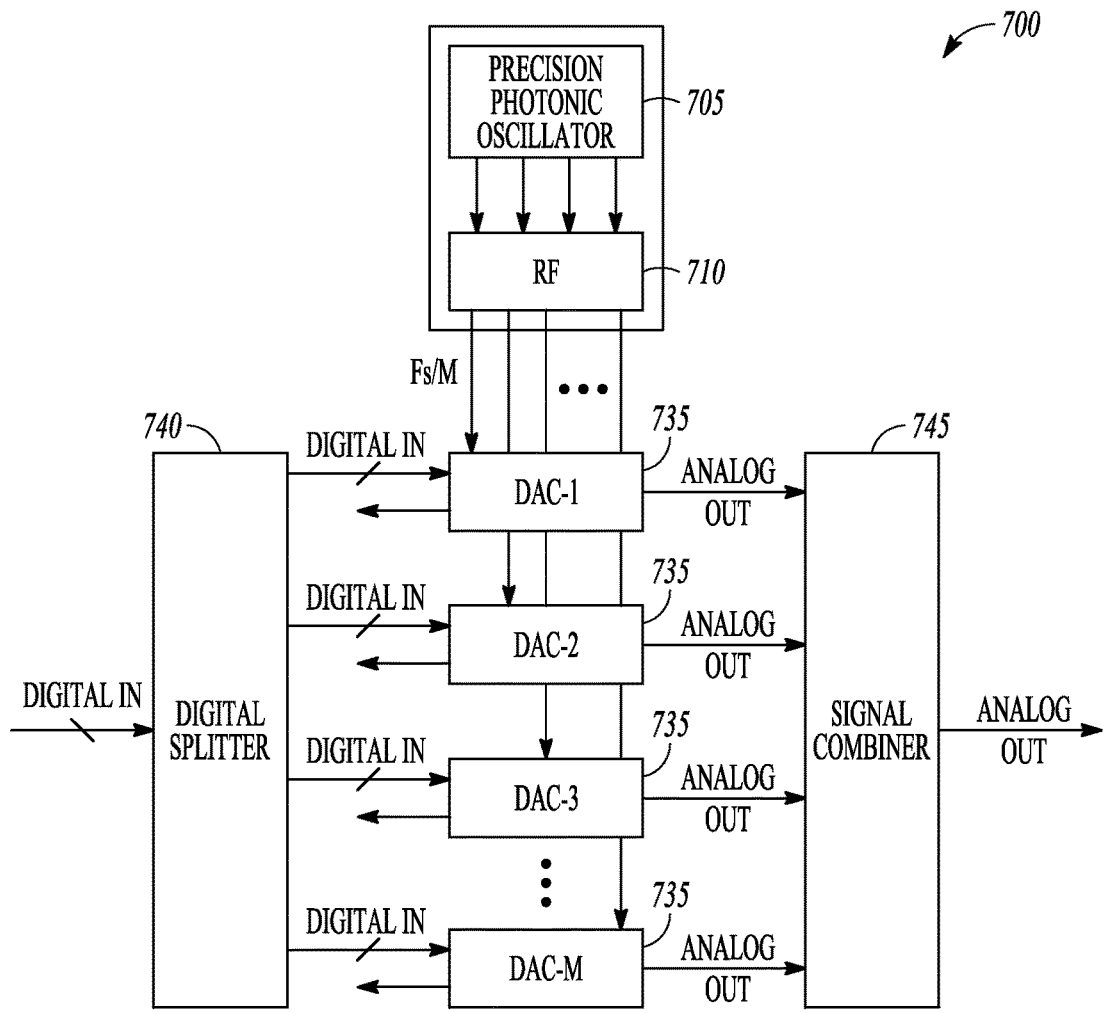
FIG. 7 is a block diagram of an example of a device to provide high speed digital-to-analog conversion.

Similar to interleaved A/D conversion, a photonic oscillator can be used to provide reference clock circuits for digital-to-analog (D/A) conversion. FIG. 7 is a block diagram of an example of a device to provide high speed digital-to-analog conversion. The device 700 includes a photonic oscillator circuit 705 and RF generating circuitry 710. The photonic oscillator circuit 705 generates optical signal pulses that are separated by a uniform delay, and the RF generating circuitry 710 receives the optical signals and produces a series of reference clock signals all having the same clock signal frequency and separated from its previous clock signal by the uniform delay.

The device 700 also includes multiple digital-to-analog (DAC) circuits 735 (e.g., M DAC circuits where M is a positive integer). Each DAC circuit 735 includes an input to receive digital values corresponding to a digital representation of an RF signal, a clock input to receive a reference clock signal of the series of reference clock signals, and an output to provide an electrical signal. The DAC circuits 735 can be arranged in parallel, and the reference clock signals may operate the DAC circuits in an interleaved manner. The digital representation of the RF signal can be decomposed into the digital values and provided to the interleaved DAC circuits 735. In some embodiments, the device 700 includes a digital splitter circuit 740 that decomposes the digital input into M components for interleaving among the DAC circuits. As the digital values provided to a DAC circuit change according to the decomposed digital inputs, the output of the DAC circuit is an electrical signal that is continuous in time and discrete in amplitude.

The device 700 further includes a signal combiner circuit 745. The signal combiner circuit 745 receives the electrical signals from the outputs of the interleaved DAC circuits and generates an RF analog signal that is continuous in both time and amplitude. The some embodiments, the signal combiner circuit 745 multiplexes the electrical signals from the outputs of the individual DAC circuits into a single electrical signal and may filter the combined signal to form the RF analog signal. If there are M DAC circuits, the DAC circuits generate segments of the RF analog signal at a rate of M times the frequency of the reference clock signal. Because the outputs of the interleaved DAC circuits change every T seconds of the inter-clock uniform delay, the generated segments of the RF analog signal have a duration of the uniform delay. The interleaved DAC conversion increases the sampling rate of the overall conversion to enable complex waveform shaping of the RF analog signal.

Figure 8:
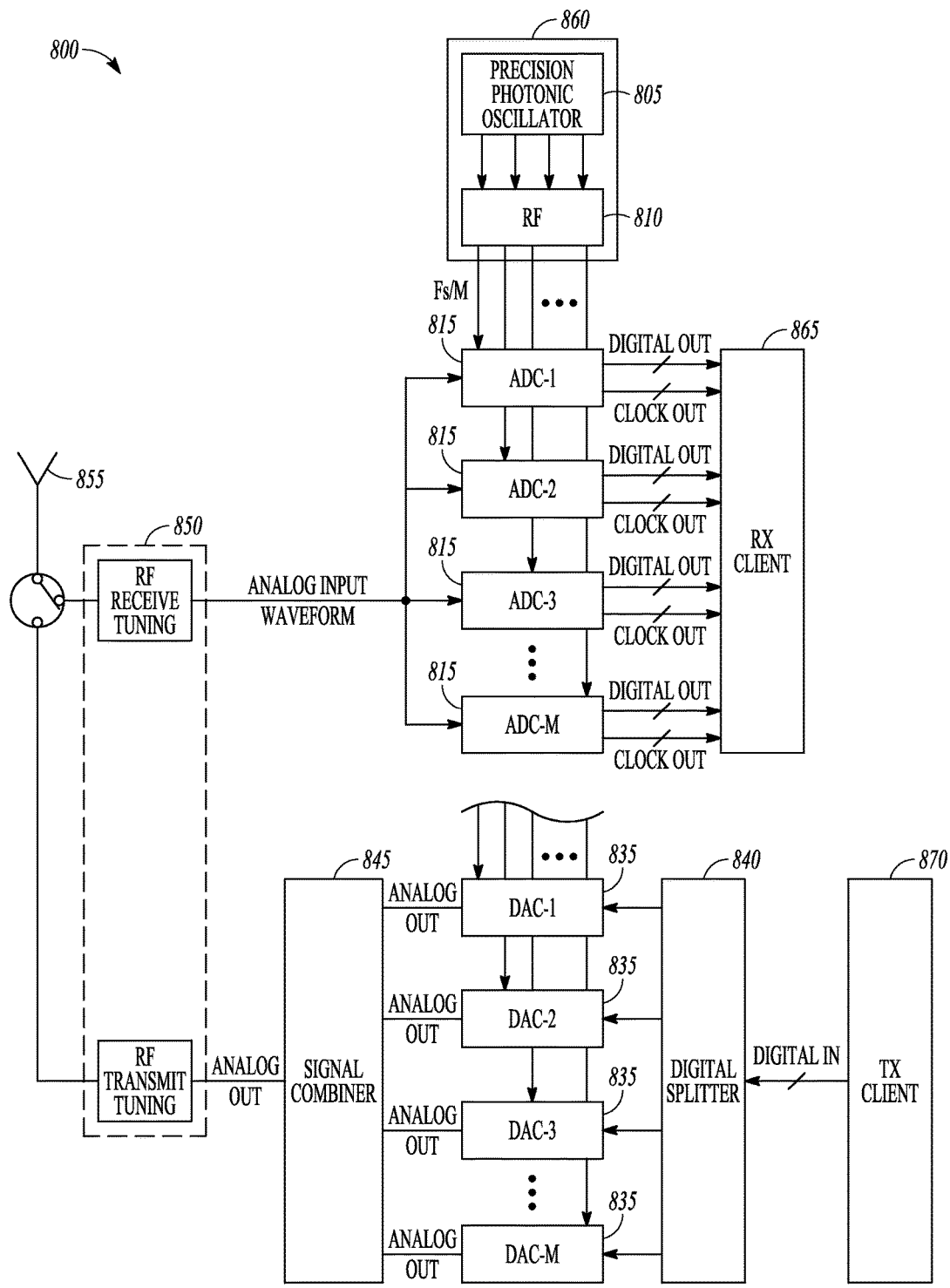
FIG. 8 is a block diagram of portions of an RF communication device.

FIG. 8 is a block diagram of portions of an RF communication device. The device 800 includes an RF transceiver circuit 850, one or more antennas 855 conductively coupled to the RF transceiver circuit 850, and an RF clock circuit 860. The RF transceiver circuit 850 receives an RF analog input signal and transmits an RF analog output signal. The RF clock circuit 860 includes a photonic oscillator circuit 805 that generates optical signals and RF generating circuitry 810 that receives the optical signals and produces a series of reference clock signals having the same clock signal frequency. Each of the reference clock signals in the series includes a uniform delay from the previous clock signal in the series.

The device also includes multiple ADC circuits. An ADC circuit 815 includes a signal input to directly receive the RF analog input signal, and a clock input to receive a reference clock signal of the repeating series of reference clock signals. The ADC circuits sample the RF analog input signal at the frequency of the reference clock signal with the uniform delay to sample interleaved digital values representing the RF analog input signal. In some embodiments, the sampled digital values are provided to a receive client 865. In these embodiments, the receive client 865 may be a process executable on a processor.

In some embodiments, the device 800 includes multiple DAC circuits. A DAC circuit 835 includes an input to receive digital values corresponding to a digital representation of an electrical analog signal, a clock input to receive a reference clock signal of the repeating series of reference clock signals, and an output to provide an electrical signal continuous in time and discrete in magnitude. The device 800 can include a digital splitter circuit 840 that decomposes the digital input into components for interleaving among the DAC circuits. The digital input may be received from a transmit client 870. The device 800 includes a signal combiner circuit 845 electrically coupled to the RF transceiver circuit 850. The signal combiner circuit 845 receives electrical signals from the outputs of the DAC circuits and generates an RF analog output signal provided to the transceiver circuit 850.

The ultra-stable frequency of the photonic oscillator circuit 805 provides timing clocks for the RF communication device that have ultra-low signal jitter. This allows for direct A/D conversion by the ADC circuits without any upfront signal processing such as a sample-and-hold circuit for each of the ADC circuits, or a front-end interleaving stage to de-multiplex the incoming analog signal and distribute the analog signal among each of the lower clock rate data converters. This significantly simplifies the circuits required for the high speed interleaved data conversion.

ADDITIONAL DESCRIPTION

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile computer-readable media during execution or at other times. These computer-readable media can include, but are not limited to, hard disks, removable magnetic disks, removable optical disks (e.g., compact disks and digital video disks), magnetic cassettes, memory cards or sticks, random access memories (RAM's), read only memories (ROM's), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   a photonic oscillator circuit configured to generate optical signals, wherein the optical signals are separated by a uniform delay;
   radio frequency (RF) generating circuitry configured to receive the optical signals and produce a series of reference clock signals having a same clock signal frequency, wherein each reference clock signal in the series includes a uniform delay from a previous clock signal in the series; and
   a plurality of analog-to-digital converter (ADC) circuits, wherein an ADC circuit includes a signal input to directly receive an RF input signal that is continuous in time and amplitude, and a clock input to receive a reference clock signal of the repeating series of reference clock signals, and wherein the ADC circuits are configured to sample a same RF input signal at the frequency of the reference clock signal with the uniform delay to sample interleaved digital values representing the RF signal.

2. The apparatus of claim 1, including a memory and a memory control circuit, wherein the plurality of ADC circuits includes M ADC circuits, wherein M is a positive integer, and wherein the memory control circuit is configured to store samples of the RF signal at a rate of M times the reference clock signal frequency.

3. The apparatus of claim 1, wherein the ADC circuits are arranged in parallel and each ADC circuit generates a sample of the same RF input signal separated in time by a uniform phase delay.

4. The apparatus of claim 1, wherein the RF generating circuitry includes a plurality of photo-detector circuits, wherein a photo-detector circuit is configured to receive an optical signal from the photonic oscillator circuit and produce a reference clock signal of the series of reference clock signals.

5. The apparatus of claim 1, including a plurality of bandpass filter circuits electrically coupled to the plurality of photo-detector circuits and configured to select the reference clock signal frequency.

6. The apparatus of claim 1, wherein the plurality of ADC circuits receive the same RF input signal at the signal input of the ADC circuits without circuitry configured to sample and hold the RF signal.

7. The apparatus of claim 1, wherein the plurality of ADC circuits receive the same RF input signal at the signal input of the ADC circuits without circuitry configured to interleave the RF signal among the plurality of ADC circuits for sampling.

8. A method comprising:
generating a repeating series of reference clock signals using a photonic oscillator, wherein each reference clock signal in the series includes a same reference clock signal frequency and a uniform delay from a previous reference clock signal in the series;
receiving a generated reference clock signal at each of a plurality of analog-to-digital converter (ADC) circuits;
receiving a radio frequency (RF) signal directly at each of the plurality ADC circuits, wherein the RF signal is continuous in time and amplitude; and
sampling the RF signal using the ADC circuits with the uniform delay to create interleaved digital values representing the RF signal.

9. The method of claim 8, wherein the plurality of ADC circuits includes M ADC circuits, wherein M is a positive integer, and wherein the method further includes storing the interleaved digital values as a digital representation of the RF signal sampled at M times the reference clock signal frequency.

10. The method of claim 9, wherein generating a repeating series of reference clock signals includes generating optical pulses using the photonic oscillator, wherein the optical pulses are separated by the uniform delay; and converting the optical pulses into the reference clock signals using a plurality of photo-detector circuits.

11. The method of claim 10, including filtering the clock signals generated by the photo-detector circuits to select the reference clock signal frequency.

12. The method of claim 9, wherein sampling the RF signal includes sampling the RF signal in parallel using the ADC circuits and separated by a uniform phase delay.

13. The method of claim 9, wherein receiving an RF signal directly at each of the plurality ADC circuits includes receiving the RF signal directly at each of the plurality of ADC circuits without circuitry configured to sample and hold the RF signal.

14. The method of claim 9, wherein receiving an RF signal directly at each of the plurality ADC circuits includes receiving the RF signal directly at each of the plurality ADC circuits without circuitry configured to interleave the RF signal among the plurality of ADC circuits for sampling.

15. An apparatus comprising:
a photonic oscillator circuit configured to generate optical signal pulses, wherein the optical signal pulses are separated by a uniform delay;
radio frequency (RF) generating circuitry configured to receive the optical signals and produce a series of reference clock signals having a same clock signal frequency, and wherein each reference clock signal in the series includes a uniform delay from a previous clock signal in the series;
a plurality of digital-to-analog (DAC) circuits, wherein each DAC circuit includes an input to receive digital values corresponding to a digital representation of an RF signal, a clock input to receive a reference clock signal of the series of reference clock signals, and an output to provide an electrical signal continuous in time and discrete in amplitude; and
a signal combiner circuit configured to receive electrical signals from the outputs of the plurality of DAC circuits and generate an RF analog signal continuous in both time and amplitude.

16. The apparatus of claim 15, wherein the plurality of DAC circuits includes M DAC circuits and generate segments of the RF analog signal at a rate of M times the frequency of the reference clock signal, wherein the generated segments of the RF analog signal have a time duration of the uniform delay.

17. The apparatus of claim 15, wherein the RF generating circuitry includes a plurality of photo-detector circuits, wherein a photo-detector circuit is configured to receive an optical signal from the photonic oscillator circuit and produce a reference clock signal of the series of reference clock signals.

18. A radio frequency (RF) communication device comprising:
an RF transceiver circuit configured to receive an RF analog input signal;
an RF clock signal circuit including:
a photonic oscillator circuit configured to generate optical signals, wherein the optical signals are separated by a uniform delay; and
RF generating circuitry configured to receive the optical signals and produce a series of reference clock signals having a same clock signal frequency, and wherein each reference clock signal in the series includes a uniform delay from a previous clock signal in the series; and
a plurality of analog-to-digital converter (ADC) circuits, wherein an ADC circuit includes a signal input to directly receive the RF analog input signal, and a clock input to receive a reference clock signal of the repeating series of reference clock signals, and wherein the ADC circuits are configured to sample the RF analog input signal at the frequency of the reference clock signal with the uniform delay to sample interleaved digital values representing the RF analog input signal.

19. The RF communication device of claim 18, including a memory and a memory control circuit, wherein the plurality of ADC circuits includes M ADC circuits, wherein M is a positive integer, and wherein the memory control circuit is configured to store samples of the RF signal at a rate of M times the reference clock signal frequency.

20. The RF communication device of claim 18, including:
a plurality of digital-to-analog (DAC) circuits, wherein each DAC circuit includes an input to receive digital values corresponding to a digital representation of an electrical analog signal, a clock input to receive a reference clock signal of the repeating series of reference clock signals, and an output to provide an electrical signal continuous in time and discrete in magnitude; and
a signal combiner circuit electrically coupled to the RF transceiver circuit, wherein the signal combiner circuit is configured to receive electrical signals from the outputs of the DAC circuits and generate an RF analog output signal.

21. The RF communication device of claim 18, including one or more antennas conductively coupled to the RF transceiver circuit.

* * * * *

UNITED STATES PATENT AND TRADEMARK OFFICE
CERTIFICATE OF CORRECTION

PATENT NO. : 9,647,827 B1  Page 1 of 1
APPLICATION NO. : 14/921157
DATED : May 9, 2017
INVENTOR(S) : Wilkinson et al.

It is certified that error appears in the above-identified patent and that said Letters Patent is hereby corrected as shown below:

On the Title Page

In item (22), in "Filed", in Column 1, Line 1, after "2015", insert --¶(65) Prior Publication Data US 2017/0118009 A1 Apr. 27, 2017--

Signed and Sealed this
Eighth Day of May, 2018

Andrei Iancu
*Director of the United States Patent and Trademark Office*